(12) United States Patent
Shibasaki et al.

(10) Patent No.: US 7,764,510 B2
(45) Date of Patent: Jul. 27, 2010

(54) ELECTRONIC APPARATUS

(75) Inventors: Akihiro Shibasaki, Nagoya (JP); Katsumi Inukai, Iwakura (JP); Tasuku Sugimoto, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 857 days.

(21) Appl. No.: 11/599,586

(22) Filed: Nov. 15, 2006

(65) Prior Publication Data

US 2007/0115640 A1    May 24, 2007

(30) Foreign Application Priority Data

Nov. 15, 2005    (JP) ............................. P2005-330768

(51) Int. Cl.
*H05K 7/00* (2006.01)

(52) U.S. Cl. ...................... 361/781; 361/760; 361/91.1; 361/679.08; 361/278; 361/811; 174/152 E; 174/261

(58) Field of Classification Search .............. 174/152 E, 174/5 R, 5 SG, 6, 7, 176, 179, 260–266, 250, 174/257, 255, 2, 37, 151, 136–138, 51; 361/91, 361/679, 680, 760, 761, 275.3, 766, 781, 361/786, 787, 807, 809, 811, 91.1, 91.2, 361/679.08, 277–278, 679.01, 748
See application file for complete search history.

(56) References Cited

U.S. PATENT DOCUMENTS

| | | | | | |
|---|---|---|---|---|---|
| 3,668,698 | A | * | 6/1972 | Demirdjioghlou et al. | .... 341/33 |
| 4,112,473 | A | * | 9/1978 | Olsen et al. | .... 361/1 |
| 5,661,279 | A | * | 8/1997 | Kenmochi | .... 200/314 |
| 6,014,066 | A | * | 1/2000 | Harberts et al. | .... 333/104 |
| 6,185,105 | B1 | * | 2/2001 | Inoguchi | .... 361/760 |
| 2005/0184313 | A1 | * | 8/2005 | Han et al. | .... 257/200 |
| 2007/0097562 | A1 | * | 5/2007 | Shinoda | .... 361/1 |

FOREIGN PATENT DOCUMENTS

| | | |
|---|---|---|
| JP | 5041568 | 2/1993 |
| JP | 10270812 | 10/1998 |
| JP | 2003069169 | 3/2003 |

* cited by examiner

*Primary Examiner*—Dameon E Levi
*Assistant Examiner*—Hoa C Nguyen
(74) *Attorney, Agent, or Firm*—Banner & Witcoff, Ltd.

(57) ABSTRACT

An electronic apparatus that includes: a circuit board; a switch attached to the circuit board; an electronic part mounted on the circuit board; a wiring pattern extending between the switch and the electronic part; and a protrusion protruding from a surface of the wiring pattern, the protrusion being disposed adjacent to the switch on the circuit board and overlapping the wiring pattern.

10 Claims, 10 Drawing Sheets

ELECTRONIC APPARATUS

CROSS REFERENCE TO RELATED APPLICATION

This application claims priority from Japanese Patent Application No. 2005-330768, filed on Nov. 15, 2005, the entire subject matter of which is incorporated herein by reference.

TECHNICAL FIELD

Aspects of the present invention relate to an electronic apparatus equipped with a circuit board having electronic parts mounted thereon.

BACKGROUND

Various electronic apparatuses such as a printer, a copying machine, a keyboard and an in-vehicle machine are equipped with a circuit board having electronic parts mounted thereon. With the increasing demand for lightness, thinness, shortness and smallness of the electronic apparatus, the wiring pattern of the circuit board is highly dense and thinned. Thus, static electricity discharged from a user may be discharged to signal lines of the circuit board. If the static electricity is discharged to the signal lines, a high voltage may be instantaneously applied to thereby break the electronic parts mounted on the circuit board.

JP-A-5-41568 discloses a configuration in which one set of discharge stylus patterns form air gaps between an earth pattern and input/output terminals. A mounting pattern, on which a resistor chip is mounted, is formed between input/output terminals and electronic parts. The distance of the air gaps formed by the discharge stylus patterns is set smaller than that of the mounting pattern of the resistor chip. Thus, the static electricity is discharged to the air gaps and released to the earth pattern and is prevented from being discharged to the mounting pattern of the resistor chip.

JP-A-10-270812 discloses a configuration, in which an insulated silk is printed on a pair of wiring patterns and on a solder resist layer arranged between the pair of wiring patterns. By this configuration, the dielectric strength is improved without widening the pattern gap between the pair of wiring patterns. Thus, the discharge to the wiring patterns can be prevented and the size of the circuit board can be reduced.

SUMMARY

JP-A-5-41568 is premised that the static electricity is discharged to a location between the input/output terminals and the mounting pattern of the resistor chip. Preventing the discharge to the input/output terminals themselves is not considered, and thus it is insufficient for protecting the electronic parts against the discharge.

According to the technique disclosed in JP-A-10-270812, the wiring patterns and the solder resist layer are covered with the insulated silk to thereby make it hard to discharge the static electricity to the wiring patterns or the solder resist layer. However, this technique does not positively discharge the static electricity to places other than the wiring patterns or the solder resist layer. Thus, the discharge to the wiring patterns or the solder resist layer cannot be completely prevented.

Aspects of the present invention provide an electronic apparatus, which can prevent the discharge to wiring patterns on a circuit board to thereby prevent electronic parts from being damaged.

DETAILED DESCRIPTION

Now, illustrative aspects of the invention will be described with reference to the accompanying drawings.

(First Aspect)

Figure 1:
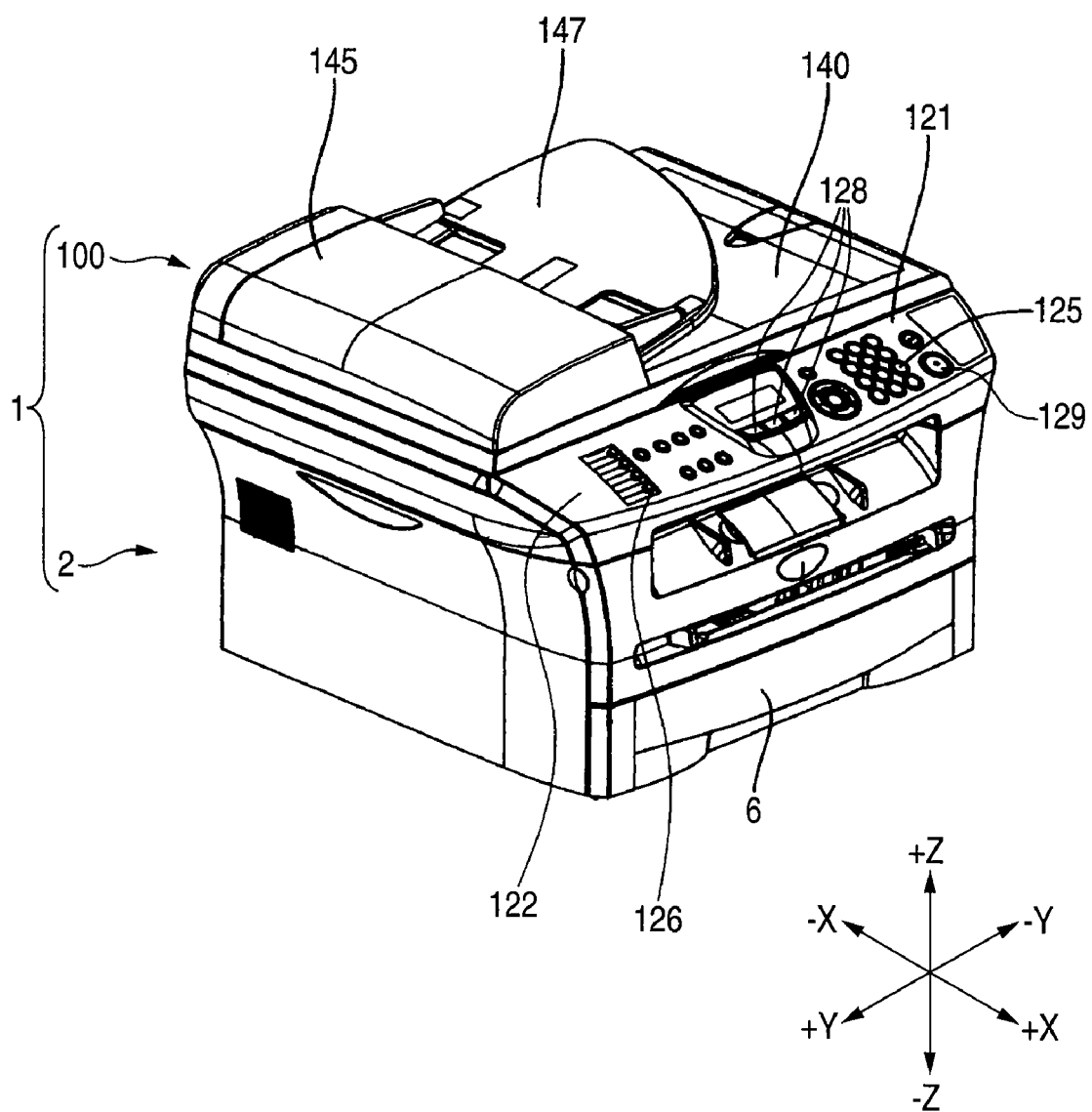
FIG. 1 is a perspective view showing a multifunction apparatus according to a first aspect of the invention.

FIG. 1 is a perspective view showing the exterior of a multifunction apparatus 1.

In this aspect, the multifunction apparatus 1 having multiple functions including a printer function, a copy function, a scanner function and a facsimile function is used as an electronic apparatus. The multifunction apparatus 1 is provided with an image forming unit 2 and an image reading unit 100. An operation unit 121 is provided so as to switch the functions and to input information.

Figure 2:
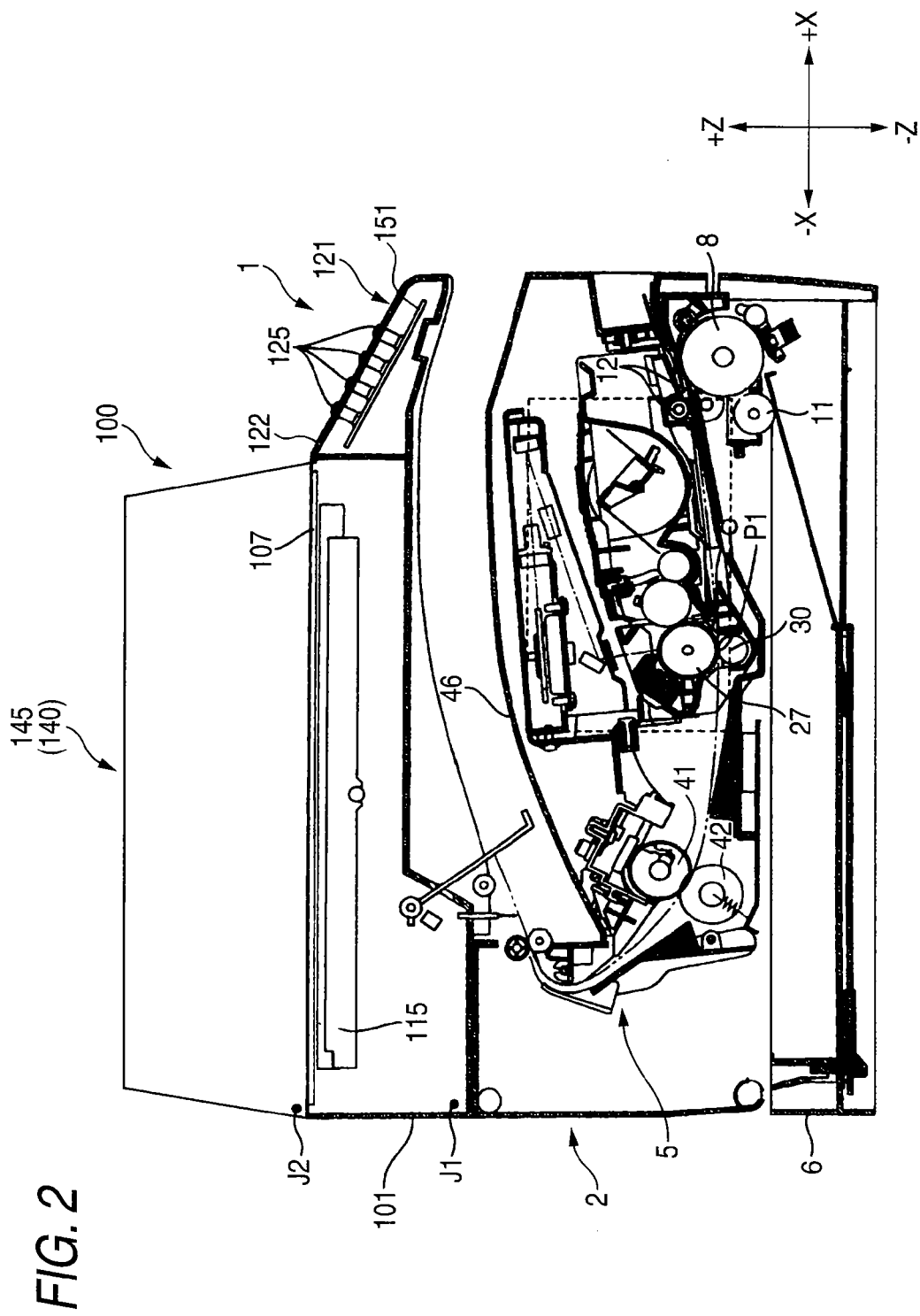
FIG. 2 is a sectional view of the multifunction apparatus shown in FIG. 1.

FIG. 2 is a sectional view of the multifunction apparatus 1 shown in FIG. 1.

In the image forming unit 2, a paper sheet housed in a paper feeder cassette 6 is picked up by a paper feeder roller 11. The paper sheet is conveyed through a separating roller 8 and a register roller 12 to an image forming portion 5, by which an image is formed on the paper sheet. The paper sheet is then discharged to a paper discharge tray 46. In the image forming portion 5, the paper sheet is conveyed from the register roller 12 to an image forming position P1 between a photosensitive roller 27 and a transfer roller 30, at which an image is transferred to the paper sheet. After this, the image is fixed between a fixing roller 41 and a pressure roller 42. The image forming unit 2 thus configured supports the image reading unit 100 rotatably on a first hinge pin J1. The image reading unit 100 covers the paper discharge tray 46.

In the image reading unit 100, a document cover 140 is rotatably held on an upper casing 101 through a second hinge pin J2. A document is placed on a platen glass 107 by opening the document cover 140, so that the image of the document is read by an image sensor 115 provided in the upper casing 101. Moreover, the image reading unit 100 is equipped with an auto document feeder (ADF) 145, which takes documents one by one from a document feeder tray 147 (see FIG. 1) and passes the taken document over the image sensor 115, which is fixed, so that the image of the document can be read.

On the front side of the image reading unit 100 (or on the +X-axis side, as shown), there is disposed an operation unit 121. This operation unit 121 comprises an operation cover 122 formed of a portion of the upper casing 101 and operation parts including input switches 125. A circuit board 151 is fixed in parallel on the back side of the operation cover 122.

As shown in FIG. 1, the operation unit 121 is equipped with various switches such as the input switches 125 for inputting the number and size of paper sheets, mode changing switches 128 for changing a copy mode, a facsimile mode and a print mode, and a start switch 129 for instructing the transmission of facsimile data and the start of a copy. Further, a display lamp 126 for displaying a mode being executed and a warning and a liquid crystal panel 127 are provided. The switches such as the input switches 125, the mode changing switches 128 and the start switch 129 are attached to the circuit board 151. A keytop 149, which will be described below, is protruded from the operation cover 122 to the outside so that it can be operated. In order to prevent the discharge of static electricity, the multifunction apparatus 1 has its exterior made of resin, and the operation cover 122 of the operation unit 121 and the keytops 149 of the input switches 125, the mode changing switches 128 and the start switch 129 are also made of resin.

Figure 3:
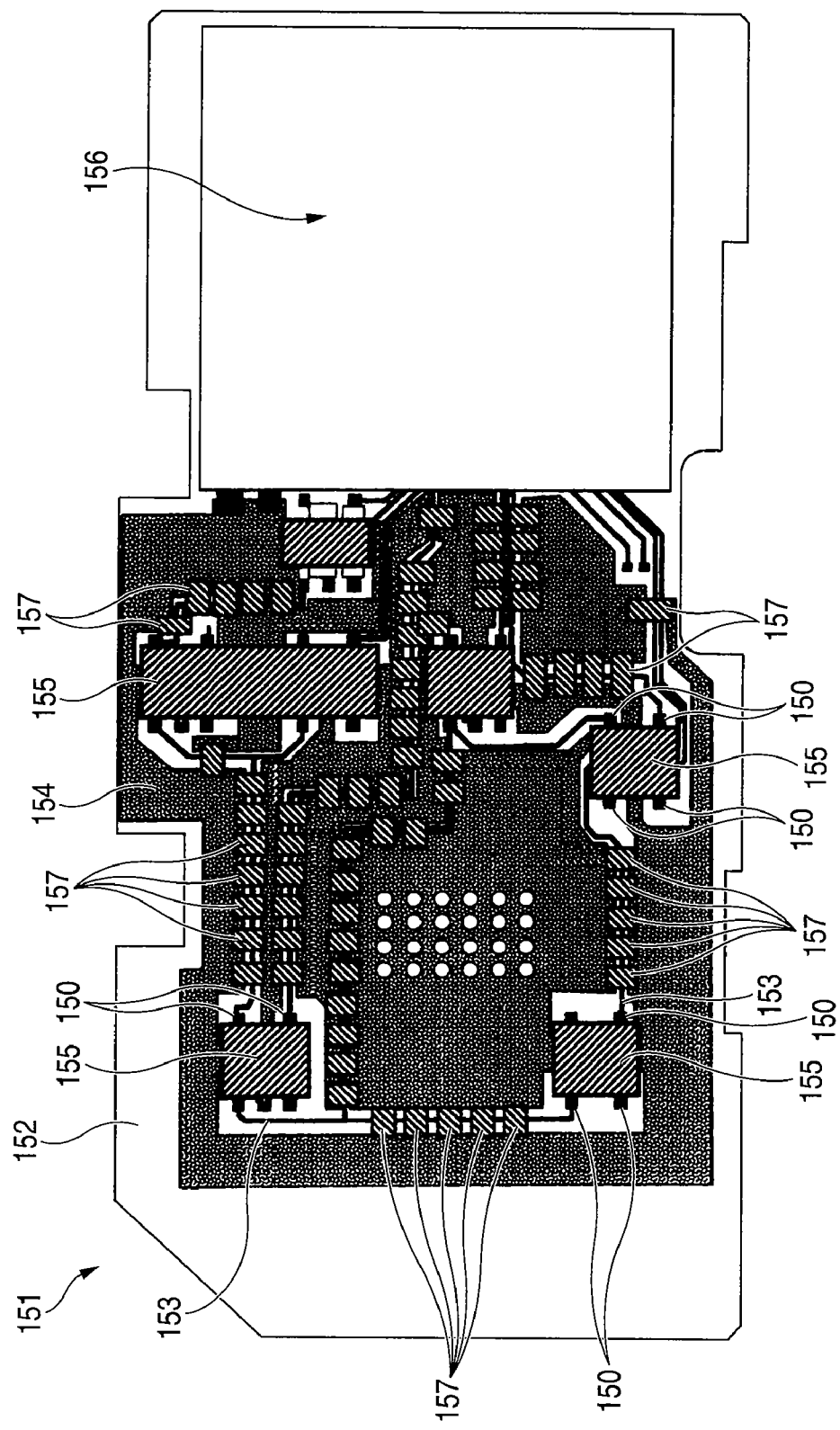
FIG. 3 is a top plan view showing a portion of a circuit board used in the multifunction apparatus shown in FIG. 1.

FIG. 3 is a top plan view showing a portion of the circuit board 151. On the circuit board 151, a solder resist (or a covering material) is formed on the surface of an insulated substrate 152 so as to cover the entirety including wiring patterns 153 and earth patterns 154. Further, a silk (or a protecting material) is formed to cover the wiring patterns 153 through the solder resist. For conveniences of the description, the solder resist and the silk are not shown in FIG. 3.

The circuit board 151 is a single-sided board, on which the wiring patterns 153 and the earth patterns 154 are formed on one side of the insulated substrate 152. The wiring patterns 153 extend from input/output terminals 150 of switches 155 mounted on the insulated substrate 152 to an LSI (or an electronic part) 156, thereby to form paths for electric signals. The earth patterns 154 are disposed around the wiring patterns 153 and the switches 155. Resistor chips (or projecting portions) 157 straddle the wiring pattern between the earth patterns 154 disposed on both sides of the wiring pattern 153. The resistor chips 157 are arranged at a constant interval on the wiring pattern 153 so as to prevent the discharge to the wiring pattern 153 reliably.

Figure 4:
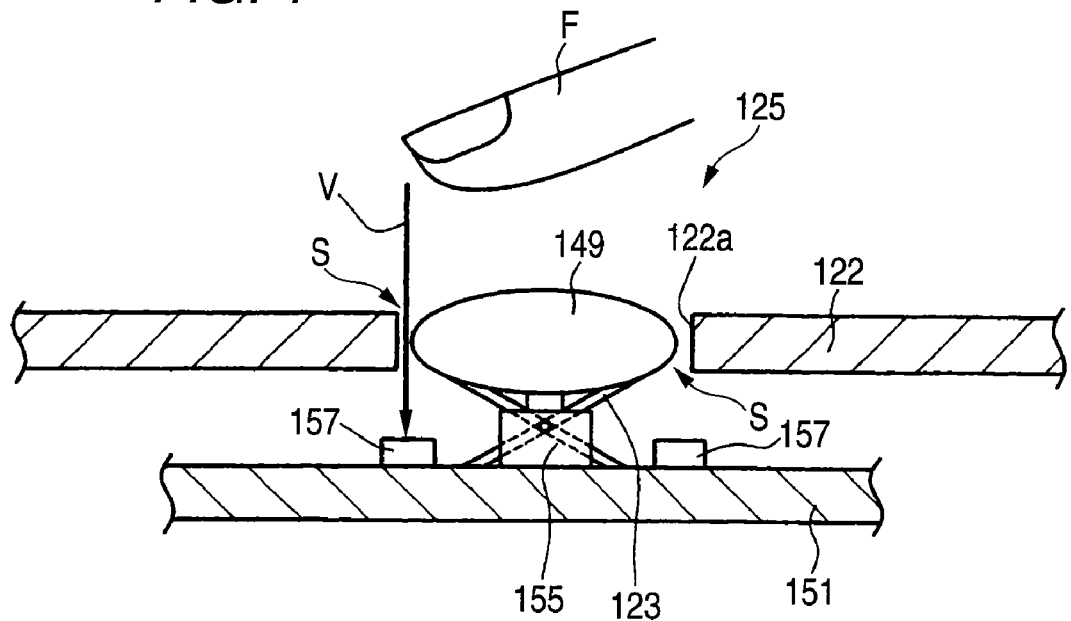
FIG. 4 is a sectional view showing an input switch of an operation unit provided on the multifunction apparatus shown in FIG. 1.
Figure 5:
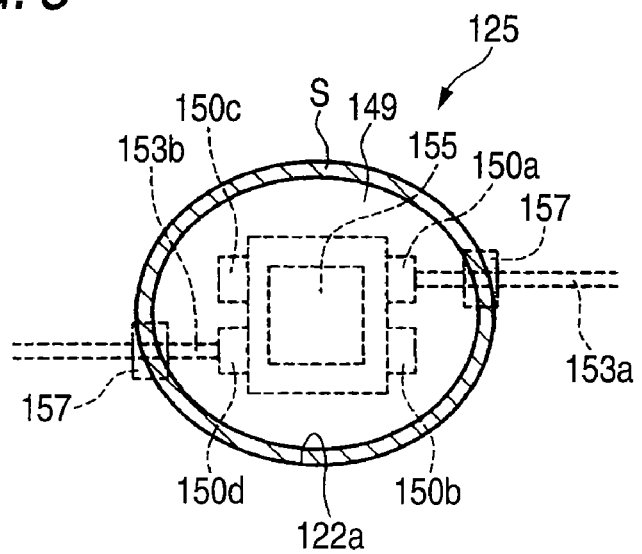
FIG. 5 is a top plan view of FIG. 4.

Next, the structure of the switches is specifically described. FIG. 4 is a sectional view showing the input switch 125 of the operation unit 121. FIG. 5 is a top plan view of FIG. 4.

The input switch 125 has its keytop 149 held vertically movably so that it is turned ON/OFF according to the position of the keytop 149. The switch 155 is equipped with four input/output terminals 150a, 150b, 150c and 150d and is fixed to the circuit board 151 by means of solder. The input/output terminals 150a and 150d of the switch 155 are connected with wiring lines 153a and 153b of the wiring pattern 153. The solder resist is not provided on the input/output terminals 150a to 150d.

The keytop 149. made of resin is so arranged over the switch 155 as to cover the switch 155. The keytop 149 is inserted into an aperture 122a formed in the operation cover 122 and is always urged upward by a link member 123 arranged between the keytop 149 and the circuit board 151. Between the resin keytop 149 and the resin operation cover 122, there is defined a gap S for enabling the keytop 149 to move smoothly. At least a part of the keytop 149 is above the operation cover 122 through the aperture 122a.

When the keytop 149 of the input switch 125 is pushed against the urging force by the link member 123, the switch 155 is pressed by the keytop 149 to electrically connect the input/output terminals 150a and 150d thereby to feed the electric current from the wiring line 153a to the wiring line 153b. When the keytop 149 is released from the pressure, the switch 155 disconnects the input/output terminals 150a and 150b to stop the current flow from the wiring line 153a to the wiring line 153b.

When the air is dry (for example, in winter), static electricity is easily stored in the human body. In case the user charged with the static electricity brings a fingertip F to the input switch 125, for example, for the copying operation, the static electricity V is not discharged to the resin operation cover 122 and the resin keytop 149 but may be discharged through the gap S formed around the keytop 149. No problem arises if the static electricity discharged through the gap S releases from the earth patterns 154 to the ground, but the high voltage may be instantaneously applied to damage the LSI 156 or the electronic part, if the static electricity is discharged to the wiring lines 153a and 153b of the wiring patterns 153. The static electricity V is likely to strike a protrusion by way of the easiest path in the same manner as thunder. Therefore, the circuit board 151 is equipped with the resistor chips 157 at least at positions on the shortest imaginary lines connecting the gap S with the circuit board 151. As a result, the circuit board 151 arranges the resistor chips 157 at positions higher than the surface of the wiring pattern 153, and gives the role as a lightning conductor to the resistor chips 157.

Figure 6:
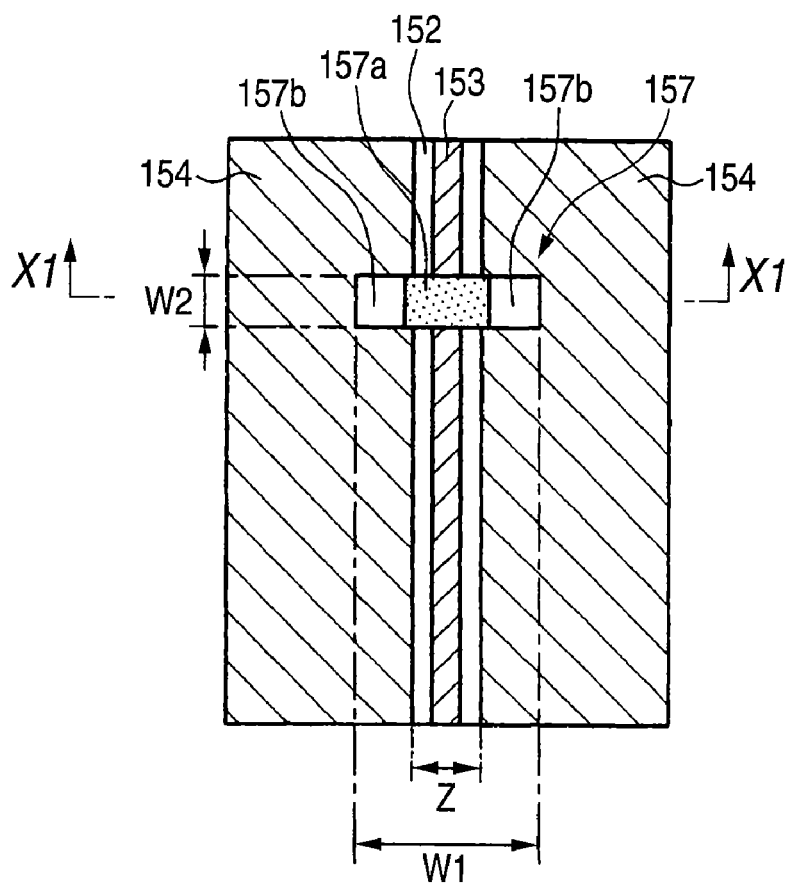
FIG. 6 is a diagram showing a resistor chip disposed in the circuit board shown in FIG. 3.

The next description is made on the resister chip 157. FIG. 6 is a diagram showing the resister chip 157, which is Disposed in the circuit board 151 shown in FIG. 3. For Conveniences of the description, the resist and the silk Are not shown in FIG. 6.

On the two sides of the wiring pattern 153 formed on the insulated substrate 152, as shown in FIG. 6, the earth patterns 154 are formed through a spacing width Z. The resistor chip 157 has a rectangular shape and includes an insulated resin portion 157a and metallic electrodes 157b and 157b attached to two sides of the insulated resin portion 157a. The resin portion 157a is made wider than the spacing width W. The electrodes 157b and 157b attached to the two sides can contact with the earth patterns 154 and 154. The transverse width W1 of the resistor chip 157 is wider than the spacing width Z. The resistor chip 157 is formed in such a rectangular shape having the transverse width W1, a longitudinal width W2 and a thickness W3 (se FIG. 7). The resistor chip 157 is easily placed and mounted on the circuit board 151. In this aspect, the spacing width Z is 0.35 to 0.50 mm, and the resistor chip 157 has the transverse width W1 of 16 mm, the longitudinal width W2 (see FIG. 6) of 0.8 mm and the thickness W3 of 0.8 mm.

Figure 7:
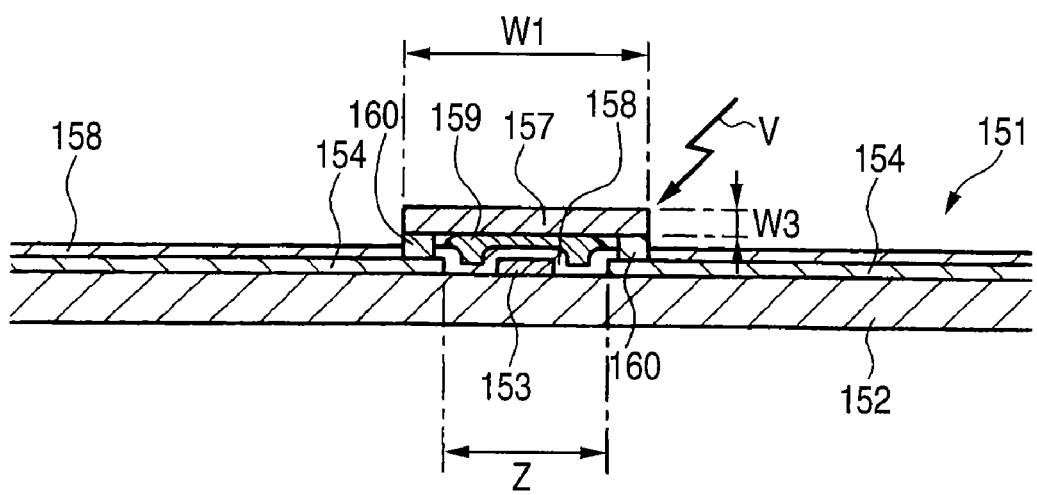
FIG. 7 is a sectional view taken along line X1-X1 of FIG. 6.

FIG. 7 is a sectional view taken along line X1-X1 of FIG. 6.

In order to stabilize the insulation of the circuit board 151, the solder resist 158 is formed to cover the wiring pattern 153 and the earth patterns 154 over the insulated substrate 152, and the silk 159 is formed along the wiring pattern 153 on the solder resist 158, so that the wiring pattern 153 is protected against the discharge by covering it with the solder resist 158 and the silk 159. In this aspect, the solder resist 158 is made of two-pack epoxy resin, and the silk 159 is made of one-pack epoxy resin. In the solder resist 158, holes are formed on the earth patterns 154.

The resistor chip 157 is arranged such that the electrodes 157b and 157b are positioned to the holes formed in the solder resist 158 and arranged to cross the wiring pattern 153 orthogonally. The resistor chip 157 is fixed at its electrodes 157b and 157b to the earth patterns 154 by means of solder 160. The resistor chip 157 and the solder 160 have little resistance so that the static electricity V easily flows from the electrodes 157b through the solder 160 to the earth patterns 154. Generally speaking, the static electricity V to charge the human body is the to have a value of about 10 KV. The resistor chip 157 has a breakdown voltage of at least 10 KV so that the static electricity does not flow from the electrodes 157b and 157b to the resin portion 157a but flows from the electrodes 157b directly to the earth patterns 154. In this aspect, the resistor chips having a breakdown voltage of 20 KV and a resistance of 0Ω are used.

Here, the resistor chips 157 are suitably selected in view of the size of the circuit board 151 and the allowable voltage of the wiring pattern 153. Thus, the size and breakdown voltage are not necessarily limited to those of this aspect. Also, a resistor chip having several tens Ω or less may be used.

With the multifunction apparatus 1 thus constructed, for example, the mode changing switches 128 of the operation unit 121 are operated to select a copy mode. The document cover 140 is then opened to set a document on the platen glass 107, and the input switch 125 is operated to set the number of copies. The image of the document is read by the image sensor 115. The paper sheet picked up from the paper feeder cassette 6 is sent to form the read image on the paper sheet. The paper sheet subjected to the image formation is discharged to the paper discharge tray 46.

When the static electricity V is discharged from the fingertip F of the user brought close to the input switch 125, as shown in FIG. 4, the static electricity V is discharged through the gap S to the circuit board 151. In this circuit board 151, at this time, the resistor chips 157 protrude high from the surface of the wiring pattern 153, and the earth patterns 154 and the wiring pattern 153 around the resistor chips 157 have a higher resistivity than that of the resistor chips 157 because they are covered with the solder resist 158 and the silk 159. As a result, the static electricity V is discharged easily to the resistor chips 157 but not to the wiring pattern 153. The static electricity V discharged to the resistor chips 157 is released through the solder 160 to the earth patterns 154. As a result, no high voltage is applied through the wiring pattern 153 to the LSI 156 so that the LSI 156 is not damaged. According to the multifunction apparatus 1 of this aspect, therefore, the discharge to the wiring patterns 153 on the circuit board 151 can be prevented and the damage of the LSI 156 can be prevented.

In the multifunction apparatus 1 of this aspect, as shown in FIG. 6 and FIG. 7, the electrodes 157b and 157b are fixed by the solder 160 on the earth patterns 154 which are positioned on the two sides of the wiring pattern 153, so that the resistor chips 157 of a low electric resistance are mounted between the earth patterns 154. The resistor chips 157 can be easily disposed at the arbitrary positions on the circuit board 151 in accordance with the circuit configuration of the wiring pattern 153 thereby to release the static electricity V through the resistor chips 157 to the earth patterns 154 having the low electric resistance. The static electricity V is easily discharged like a thunder to the protruding objects so that the resistor chips 157 play the role like the lightning conductor to promote the discharge to the earth patterns 154.

In the multifunction apparatus 1 of this aspect, moreover, the gap S is formed around the keytop 149 of the input switch 125, and the resistor chips 157 are disposed at such positions as to minimize the distance from the gap S to the circuit board 151 (see FIG. 4 and FIG. 5). As a result, the static electricity V, as discharged from that gap S to the circuit board 151, can be efficiently discharged to the resistor chips 157 without being discharged to the wiring pattern 153.

Moreover, at least the wiring pattern 153 is covered with the insulated solder resist 158 and the silk 159 thereby to raise the electric resistance so that the static electricity V can be more reliably prevented from being discharged to the wiring pattern 153.

Now, modifications-of the resistor chips 157 are described with reference to FIG. 8 to FIG. 11. In the circuit boards 151 of the modifications, the solder resist 158 and the silk 159 are formed but are not shown for conveniences of the description.

Figure 8:
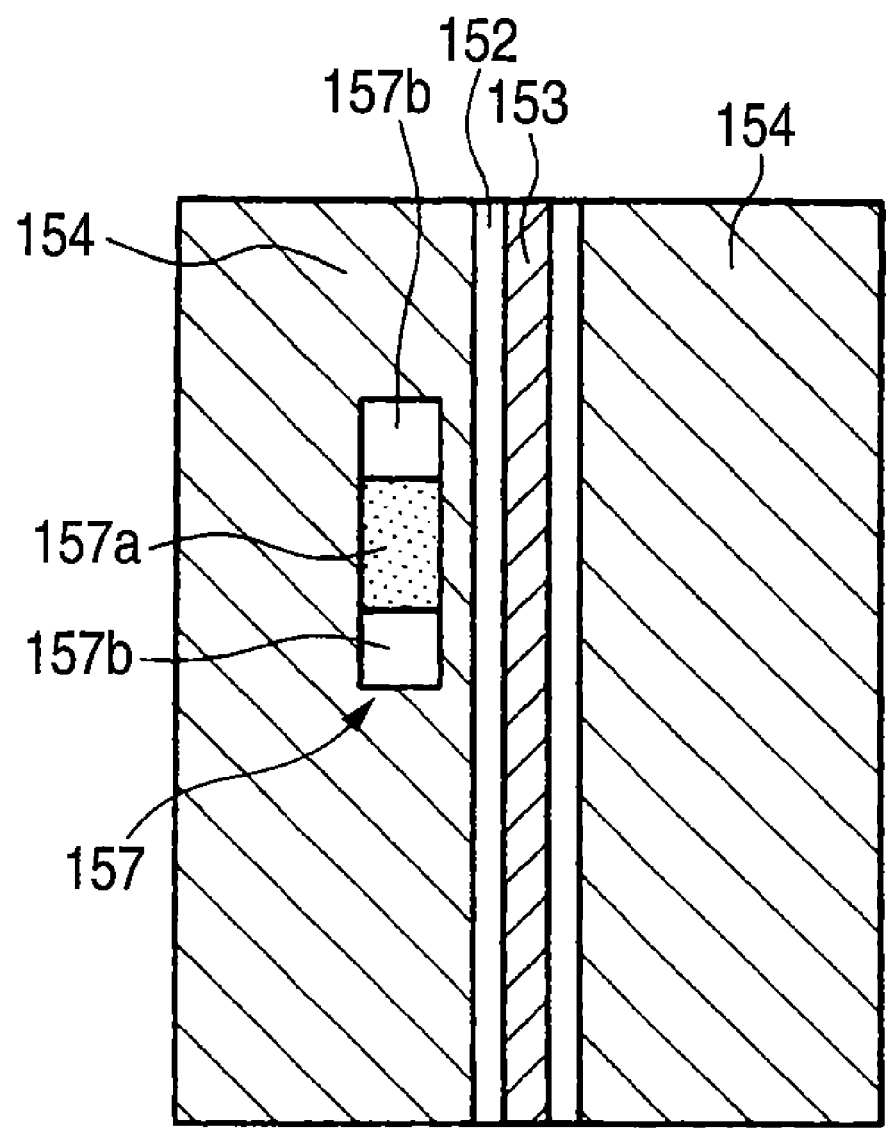
FIG. 8 is a diagram showing an arrangement modification of the resistor chip shown in FIG. 6.

FIG. 8 is a diagram showing an arrangement modification of the resistor chips 157 shown in FIG. 6.

The resistor chips 157 of the aforementioned first aspect are disposed across the wiring pattern 153, as shown in FIG. 6 and FIG. 7. As shown in FIG. 8, the resistor chip 157 may also be arranged on one of the earth patterns 154 disposed on the two sides of the wiring pattern 153 and along the wiring pattern 153. Although not shown, the resistor chips 157 may also be arranged along the wiring pattern 153 and on the two sides of the earth patterns 154.

Figure 9:
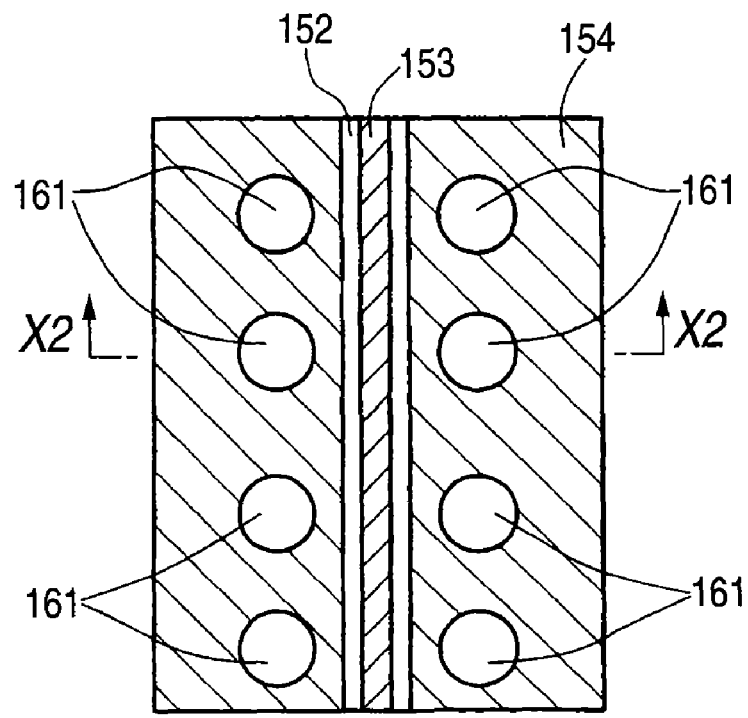
FIG. 9 is a top plan view of a solder portion of a modification of protrusions.
Figure 10:
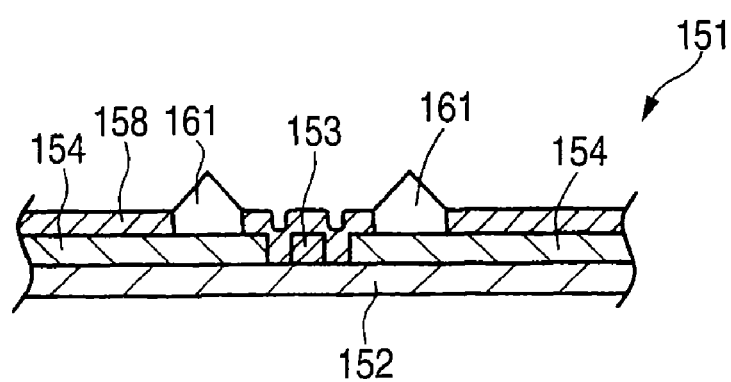
FIG. 10 is a sectional view taken along line X2-X2 of FIG. 9.

FIG. 9 shows a modification of the protrusions. FIG. 10 is a sectional view taken along X2-X2 of FIG. 9. Here, FIG. 10 omits only the silk 159.

In the foregoing first aspect, the protrusions are formed of the resistor chips 157. As shown in FIG. 9 and FIG. 10, the solder may be welded along the wiring pattern 153 on the earth patterns 154 positioned on the two sides of the wiring pattern 153, thereby to form conical protrusions 161 protruding from the surface of the wiring pattern 153. The reason for the conical shape is to facilitate the discharge of the static electricity V. The protrusions 161 are formed conical but may also be formed elliptical or semicircular. Here, the protrusions 161 of the solder can be easily formed by forming the through holes in the portions corresponding to the protrusions 161 of the solder resist 158 and then by heaping up the solder into those through holes.

Figure 11:
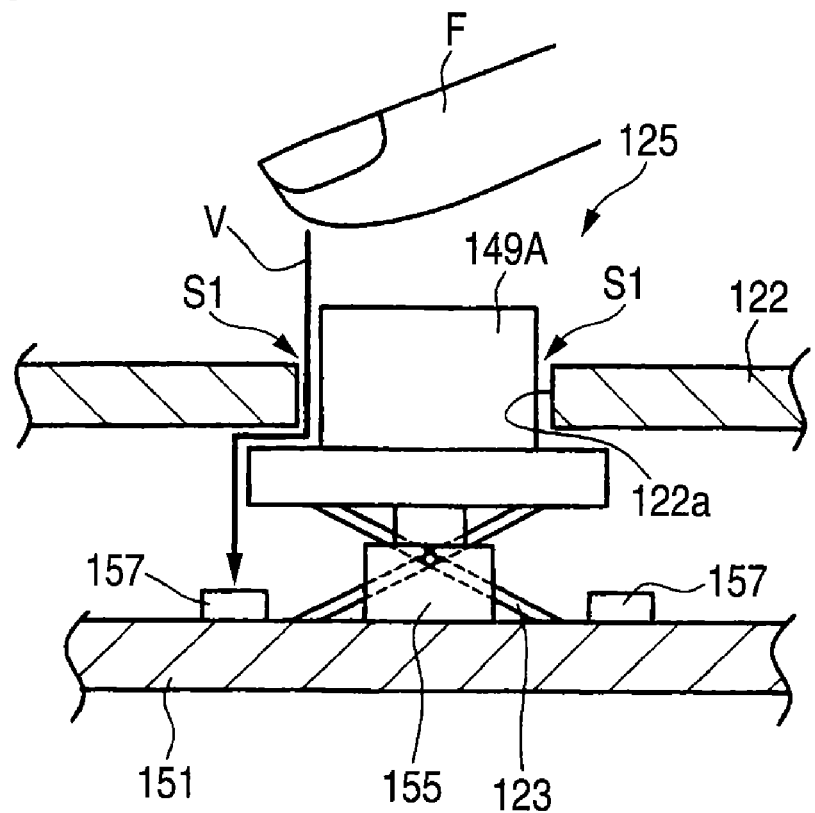
FIG. 11 shows a modification of the operation unit.

FIG. 11 shows a modification of the operation unit 121.

A keytop 149A having a cylindrical body portion opened in one side and having a flange portion is used for the input switch 125. This keytop 149A has its cylindrical body portion inserted into the aperture 122a of the operation cover 122 so that the flange portion is engageable with a radially inner portion of the aperture 122a. In this case, a crank-shaped gap S1 is formed between the keytop 149A and the operation cover 122. The static electricity V is discharged through the gap S1 to the circuit board 151, but is discharged to the resistor chips 157 and released to the earth patterns 154, if the resistor chips 157 are disposed at the positions to minimize the distance between the gap S1 and the circuit board 151.

(Second Aspect)

Figure 12:
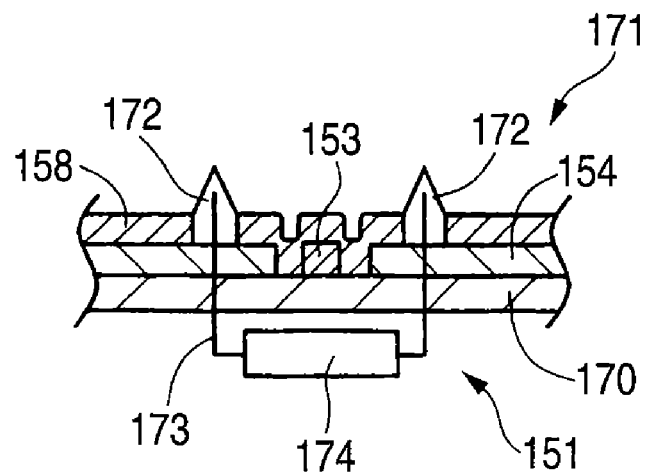
FIG. 12 is a sectional view showing a conductive member attached to a circuit board to be used in an electronic apparatus according to a second aspect of the invention.

Next, a second aspect of the invention will be described. FIG. 12 is a sectional view showing a conductive member 171, which is attached to a circuit board 151 to be used in a multifunction apparatus 1 of the second aspect.

The multifunction apparatus 1 of this aspect is different from the first aspect, which has the resistor chips 157 mounted on the circuit board 151 of the single-sided board, in that the circuit board 151 is a double-sided board. The circuit board 151 has the wiring pattern 153 on the two sides of an insulated substrate 170. The multifunction apparatus 1 of this aspect is further different from the first aspect in that the conductive member 171 is used as the protrusions. However, the remaining points are common. Therefore, the description is made by centering the conductive member 171, which is different from the first aspect, but the portions common to those of the first aspect are omitted in description while being designated by the common reference numerals.

The conductive member 171 is constructed such that conductive wires 173 of a tip part 174 is penetrated through the circuit board 151 from the lower side to the upper side of the drawing thereby to fix the leading end portions of the conductive wires 173 by means of solder. In the conductive member 171, the conductors 173 are so extended upward through the insulated substrate 170 and the earth patterns 154 as to contact with the earth patterns 154. The solder is heaped up in conical shapes around the conductive wires 173 into the hole portions corresponding to the protrusions 172 of the solder resist 158, thereby to constitute the protrusions 172. Here, the conductive wires 173 may be jumper wires.

This conductive member 171 discharges the static electricity V, discharged from the gap S of the operation unit 121 to the circuit board 151, to the protrusions 172, and releases the static electricity V to the earth patterns 154 through the conductive wires 173.

In the multifunction apparatus 1 of this aspect, therefore, the conductive member 171 can be easily disposed at an arbitrary position on the circuit board 151 in accordance with the circuit constitution of the wiring pattern 153 thereby to release the static electricity V from the conductive member 171 to the earth patterns 154 having a small electric resistance. The static electricity V is easily discharged like the thunder from the protrusion and because the conductive member 171 plays a role similar to that of the lightning conductor thereby to promote the discharge to the earth patterns 154.

(Third Aspect)

Figure 13:
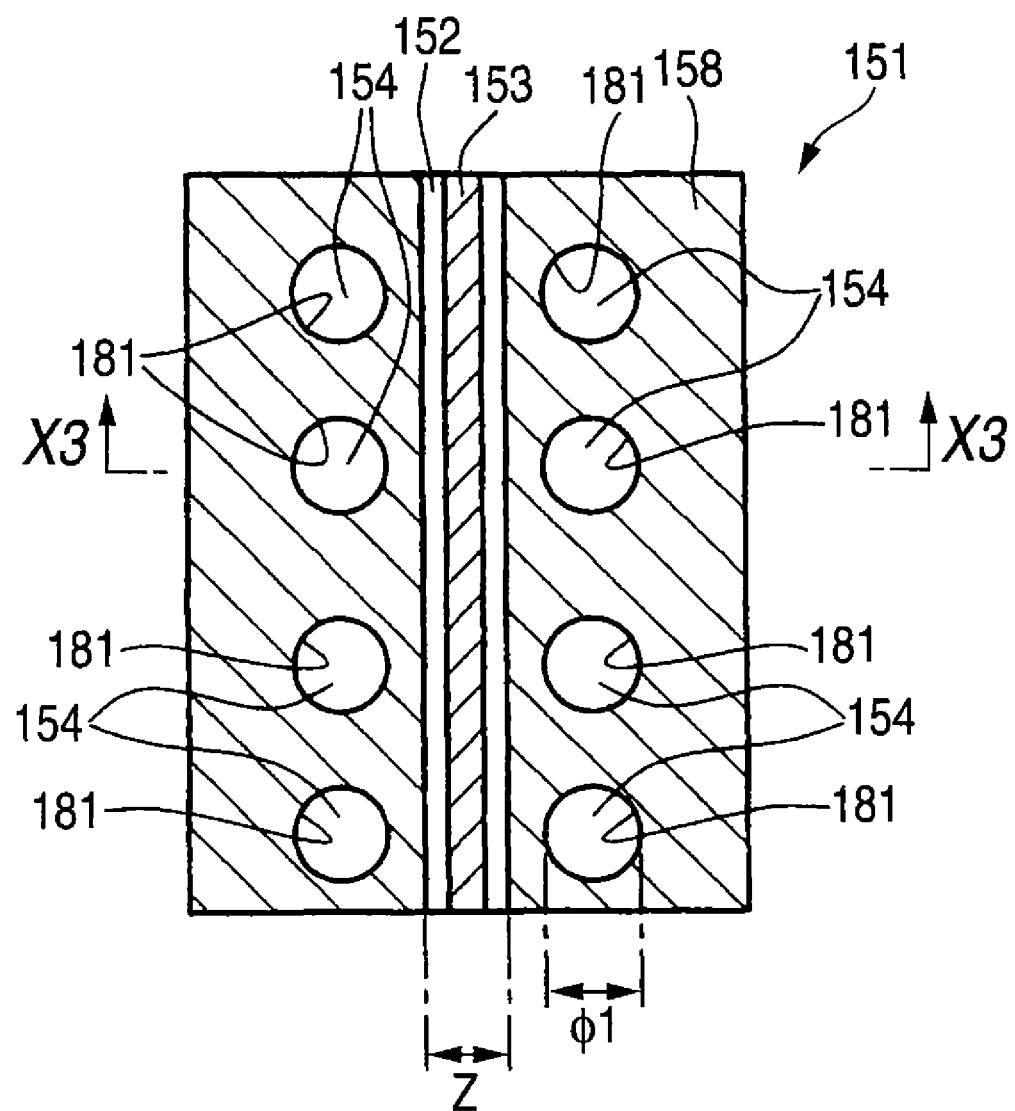
FIG. 13 is an enlarged view showing the periphery of through holes of an electronic apparatus according to a third aspect of the invention.
Figure 14:
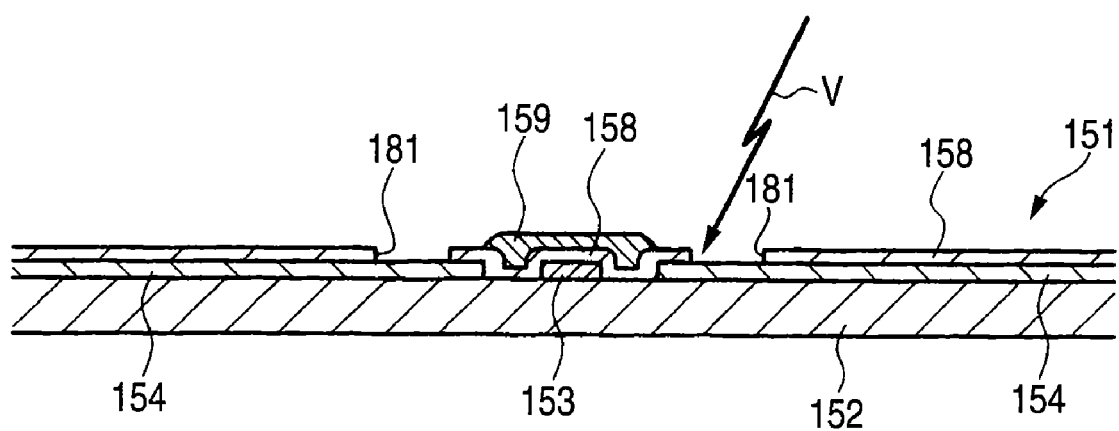
FIG. 14 is a sectional view taken along line X3-X3 of FIG. 13.

Next, a third aspect of the invention will be described. FIG. 13 is an enlarged diagram showing the periphery of through holes 181 formed in the multifunction apparatus 1. FIG. 14 is a sectional view taken along line X3-X3 of FIG. 13. FIG. 13 omits the solder resist 158 and the protecting material 159 formed on the wiring pattern 153, for conveniences of the description.

The multifunction apparatus 1 of this aspect is different, in the provision of the through holes 181, from the first aspect having the resistor chips 157, but shares the remaining points. Therefore, the description is made by centering the through holes 181, which is different from the first aspect, but the portions common to those of the first aspect are omitted in description while being designated by the common reference numerals.

In the circuit board 151, as shown in FIG. 13 and FIG. 14, the earth patterns 154 are formed on the two sides of the wiring pattern 153, and the solder resist 158 is formed to cover the wiring pattern 153 and the earth patterns 154. In the solder resist 158, the through holes 181 are formed in a circular shape on the earth patterns 154 on the two sides of the wiring pattern 153. The earth patterns 154 have a lower insulation than those of the solder resist 158 and the silk 159. Therefore, the earth patterns 154 of the circular shape, which are exposed through the through holes 181, are more easily subjected to discharge than the surrounding solder resist 158 and silk 159.

In this circuit board 151, the static electricity V is discharged through the through holes 181 to the earth patterns 154 thereby to prevent the discharge to the wiring pattern 153, so that the high voltage is not instantaneously applied to damage the LSI 156. According to the multifunction apparatus 1 of this aspect, therefore, it is possible to prevent the discharge to the wiring pattern 153 thereby to prevent the breakage of the LSI 156, which is connected through the wiring pattern 153 with the input/output terminals 150 of the switch 155 to be operated by the user.

Here, if the through hole 181 is formed just below the gap S formed around the keytop 149 of the switch 155, the static electricity V is easily discharged to the earth patterns 154 from the gap S through the through hole 181.

Also in this aspect, the wiring pattern 153 is wrapped with the silk 159 on the solder resist 158 so that the static electricity V can be more reliably prevented from being discharged to the wiring pattern 153.

Although the aspects of the invention have been described, the invention is not limited to the foregoing aspects but may be variously modified.

(1) For example, the foregoing aspects have been described on the electronic apparatus to be used in the laser printer. However, the structure of the aspects can be applied to an electronic apparatus having the gap around the switch, such as an ink jet printer, a keyboard of a personal computer, or an operation unit of an in-vehicle electronic apparatus.

(2) In the foregoing aspects, the circuit board has been exemplified by the rigid circuit board, in which the wiring patterns are formed on the insulated substrate. However, the rigid flex wiring board or the flexible wiring board may be used as the circuit board.

(3) In the foregoing aspects, the resistor chips 157 are so arranged at a small pitch as to cover the wiring pattern 153 thereby to prevent the static electricity V from being discharged into the wiring pattern 153. Using a lot of resistor chips 157 increases the cost. Therefore, the resistor chips 157 may be disposed at least at positions on the shortest imaginary lines connecting the gap S formed on the operation portion unit 121 with the circuit board 151, thereby to reduce the costs.

(4) The foregoing aspects have been described on the case, in which the gap S is formed between the aperture 122a of the operation cover 122 and the keytop 149. Even in case the gap S is formed between the adjoining keys such as the keys of the keyboard for the personal computer, the protrusions (e.g., the resistor chips 157 or the conductive members 171) may be formed on the circuit board 151 thereby to prevent the static electricity V from being discharged to the wiring pattern 153. Also in this case, the resistor chips 157 may be fixed at positions on the shortest imaginary lines connecting the gap S between the keys with the circuit board 151.

(5) In the foregoing aspects, the silk 159 is formed to cover only the wiring pattern 153. However, the silk 159 may be disposed to cover the earth patterns 154 partially or wholly.

What is claimed is:

1. An electronic apparatus comprising:
   a circuit board;
   a switch attached to the circuit board;
   an electronic part mounted on the circuit board;

a wiring pattern extending between the switch and the electronic part;

a protrusion protruding from a surface of the wiring pattern, the protrusion being disposed adjacent to the switch on the circuit board and overlapping the wiring pattern, and being stationary during a switching operation of the switch.

2. The electronic apparatus according to claim 1, wherein the circuit board includes earth patterns formed on both sides of the wiring pattern, and the protrusion is a resistor chip disposed across the wiring pattern and interposed between the earth patterns.

3. The electronic apparatus according to claim 1, wherein the circuit board includes earth patterns formed on both sides of the wiring pattern, and the protrusion includes conductive members penetrating the earth patterns and the circuit board.

4. The electronic apparatus according to claim 1, further comprising:

a cover that overlaps the circuit board with a space between the cover and the circuit board, the cover including an aperture, wherein the switch comprises a keytop, at least a part of the keytop being above the cover through the aperture, a gap being defined between the keytop and the cover, and the protrusion is disposed on the shortest imaginary line connecting the gap with the circuit board.

5. The electronic apparatus according to claim 1, wherein the wiring pattern is covered with an insulated cover member and a protecting member.

6. The electronic apparatus according to claim 1, wherein the switch includes a plurality of input/output terminals and the switch is configured to turn on and off a connection between wirings of the wiring pattern connected to the input/output terminals.

7. The electronic apparatus according to claim 1, wherein the protrusion is one of a plurality of protrusions protruding from the surface of the wiring portion.

8. The electronic apparatus according to claim 7, wherein the plurality of protrusions is arranged at a constant interval on the wiring pattern.

9. The electronic apparatus according to claim 1, wherein the protrusion has a rectangular shape.

10. The electronic apparatus according to claim 9, wherein a longitudinal direction of the rectangular shape of the protrusion is orthogonal to the wiring pattern.

\* \* \* \* \*